United States Patent
Hsu et al.

(10) Patent No.: US 6,320,519 B1
(45) Date of Patent: Nov. 20, 2001

(54) KEYBOARD AND METHOD FOR SWITCHING KEY CODE WITH A SINGLE MODIFIER KEY

(75) Inventors: Hong-Chang Hsu; Huang-Hsiao Kao, both of Taipei Hsien; Min-Shan Chuang, Taoyuan, all of (TW)

(73) Assignee: Acer Peripherals, Inc., Taoyuan (TW)

(*) Notice: Subject to any disclaimer, the term of this patent is extended or adjusted under 35 U.S.C. 154(b) by 0 days.

(21) Appl. No.: 09/176,190

(22) Filed: Oct. 21, 1998

(30) Foreign Application Priority Data

Oct. 22, 1997 (TW) .................................................. 86115641

(51) Int. Cl.[7] ............................ H03K 17/94; H03M 11/00
(52) U.S. Cl. ................................ 341/23; 341/22; 341/26; 345/172; 400/476; 703/145
(58) Field of Search .................................. 341/20, 22, 23, 341/26; 345/172; 708/144, 145, 146; 400/476, 477

(56) References Cited

U.S. PATENT DOCUMENTS 5,574,447 * 11/1996 Roylance ................................ 341/22
6,011,495 * 1/2000 Chen ...................................... 341/22

\* cited by examiner

*Primary Examiner*—Timothy Edward, Jr.
(74) *Attorney, Agent, or Firm*—Ladas & Parry

(57) ABSTRACT

A keyboard with key codes switchable by means of a single modifier key and a method of control thereof are provided. When a modifier key such as an Alt key, a Ctrl key, or a Shift key is pressed and then immediately released, the set of key codes is switched to another if no other modifiable key stroke is inserted during the press-and-release operation. Consequently, multimedia hot keys will be obtained by switching the key code set to another set of key coding that represents individual multimedia functions. Following the press-and-release of the Alt key, the Ctrl key, or the Shift key which activated the multimedia function, the key code set returns to the original key code set

10 Claims, 2 Drawing Sheets

KEYBOARD AND METHOD FOR SWITCHING KEY CODE WITH A SINGLE MODIFIER KEY

BACKGROUND OF THE INVENTION

1. Field of the Invention

The present invention relates to an input device for use with a computer system, and particularly to a keyboard and method for switching key code sets with a single modifier key.

2. Description of the Related Art

With ever increasing speed of the central processing unit (CPU), the capability of processing multimedia information such as audio and video data has become a required feature in current computer system configurations. Control of multimedia operations in prior art computer systems is largely obtained by switching between software applications through mouse operation. For instance, under the Windows operation system environment, it is typical to switch from one software application to another by selecting the required application with a series of mouse points-and-clicks. However, a series of complicated, and hence inconvenient, mouse movements, relocations and point-and-click actions will be required to browse through the video data in a DVD, listen to the music in an Audio CD, connect to a modem, or even make adjustments in the volume, quality and balance of sounds and so on.

Therefore, it has been proposed that a number of hot keys, such as CD, Video, Play, Fast Forward (FF), Fast Rewind (FR), Volume Up (Volume+), Volume Down (Volume-), Mute, Telephone, etc., be incorporated into the keyboard as an input device of the computer system to allow user interaction with the multimedia resources in the computer system through those hot keys. However, the implementation of those hot keys will require the consideration of factors such as increasing keyboard size, or retaining original keyboard size but decreasing hot key size. Any method is sure to increase cost by adding more wires and making new molds.

Another solution is accomplished with a multiple key combination method; for example, by first pressing and holding one of the Ctrl, Alt, and Shift keys and then striking another predetermined key such as a Function key of F1 to F12, so as to activate multimedia functions. Though without the drawback of increasing cost by adding more wires and making new molds as described in the hotkey method mentioned above, to activate a specific multimedia function with this method the user must simultaneously press with two fingers to preset combination keys and to memorize the representative functions of the key combinations. Such practice is therefore inconvenient to the user. Further, the selected key combinations might be used in some application software, thereby making the system function incomplete.

SUMMARY OF THE INVENTION

Accordingly, the present invention is made to resolve the aforementioned drawbacks occurring to the prior art. It is therefore an object of the present invention to provide a keyboard for use with computer systems and a method for switching key codes with a single modifier key.

It is another object of the invention to provide a keyboard for use with computer systems and a method for switching the Function keys, the PrintScreen key, the ScrollLock key, or the Pause key, with a single modifier key without altering the mechanical structure of a standard keyboard.

The above objects can be achieved with the striking of a single modifier key on the keyboard of the present invention, wherein the keyboard comprises: an array of keys, a memory device and a detecting device. The array of keys comprises at least one modifier key and a plurality of switchable keys. The memory device is for storing a first key code set and a second key code set. The detecting device detects whether a modifier key is pressed. Moreover, the switchable keys are set to the first key code set when it is detected that the modifier key has been struck an even number of times; the switchable keys are set to the second key code set when it is detected that the modifier key has been struck an odd number of times. However, the detecting device does not increase the number of times the modifier key has been struck when the modifier key is pressed and held while a modifiable key is struck.

Further, it is provided in the present invention a method of switching a plurality of switchable keys between a first key code set and a second key code set with a single modifier key. The method in accordance with the present invention is suited to a keyboard comprising at least one modifier key and a plurality of switchable keys. First of all, a detecting device detects whether a modifier key has been pressed and released. The switchable keys are set to the first key code set when it is detected that the modifier key has been struck an even number of times. The switchable keys are set to the second key code set when it is detected that the modifier key has been struck an odd number of times; however, the detecting device does not increase the number of times the modifier key has been struck when the modifier key is pressed and held while a modifiable key is struck.

BRIEF DESCRIPTION OF THE DRAWINGS

Further objects, features and advantages of the present invention will become apparent from the following detailed description of a preferred embodiment of the invention with reference to the accompanying drawings.

DETAILED DESCRIPTION OF THE INVENTION

Many keyboards have an Alt key, Ctrl key, and Shift key that change the function and character of a simultaneously struck key. For example, a key combination of pressing the Shift+A inputs a capital letter A, and a key combination of the Ctrl+C interrupts an operation in the DOS mode. Consequently, the Ctrl key, the Alt key, and the Shift key are called "modifier keys" while the key having a function that is altered by the modifier keys referred to as "modifiable keys."

It is known that when a modifier key is pressed, the system will then set an associated modifier-active flag and initializes an associated recent-modifier counter. In other words, pressing and holding the modifier key for a while is merely an update of key status, but will not make the system take any action. Such status provides reference to some programs, such as basic input/output system (BIOS), operation system (OS) or some application software. Whenever the modifier key is released, the modifier-active flag is cleared, and then the recent-modifier counter is decremented once per predetermined time period the modifier-active flag is not set, until it reaches zero. That is, a press and a release of a modifier key without any other modifiable key intervention simply sets and resets the status of a modifier key; the modifier key exerts no substantial function.

By taking advantage of this feature, the present invention changes the key code of the Function keys, the PrintScreen key, the ScrollLock key and the Pause key from an original set to another only when a modifier key is pressed and immediately released without the insertion of any modifiable key strokes. The newly switched key code set may represent various multimedia functions and enables the Function keys, the PrintScreen key, the ScrollLock key or the Pause key, to become multimedia hot keys.

Figure 1:
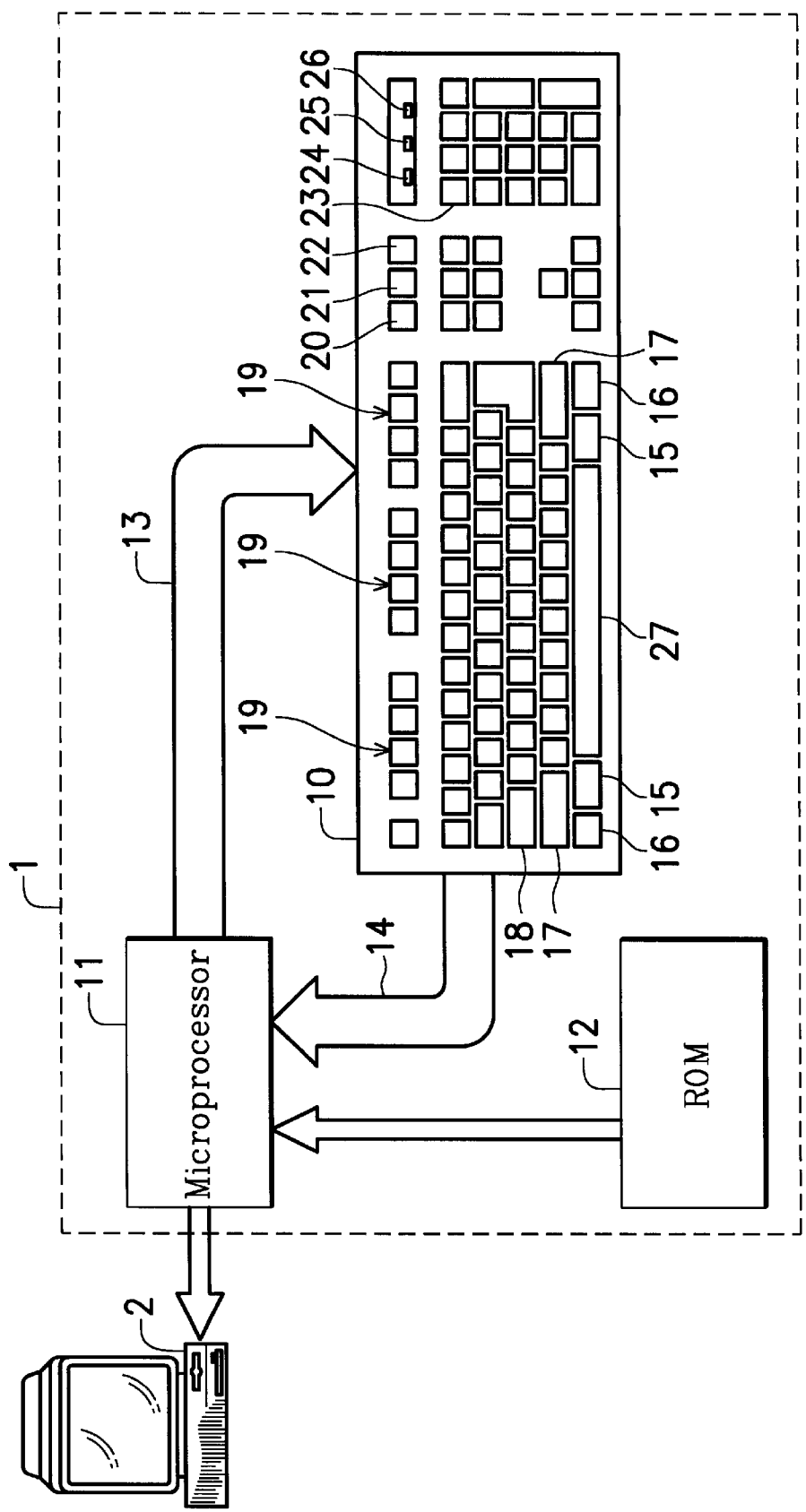
FIG. 1 is a block diagram illustrating the connection of a keyboard with a computer.

Referring to FIG. 1, the keyboard according to the present invention comprises at least: an array of keys 10, a microprocessor 11, a read only memory (ROM) 12. The microprocessor 11 performs operations according to the program stored in the read only memory 12. The read only memory 12 stores the key code represented by each individual key on the array of keys 10; specifically, it stores the original key code set represented by the Function keys, the ScrollLock keys or the Pause key, and the key code set representing multimedia functions after the key code has been switched. As to the field of application, the read only memory 12 can be incorporated into the microprocessor 11. Basically, after microprocessor 11 outputs a scan signal, the keyboard 1 is aware which key among the various keys in the array of keys 10 has been pressed and delivers the key code corresponding to the pressed key to the main computer 2.

The array of keys 10 comprises a plurality of keys. In the standard 101-key keyboard layout of an IBM PC, the array of keys 10 comprises a pair of Alt keys 15, a pair of Ctrl keys 16, a pair of Shift keys 17, a CapsLock key 18, twelve function keys 19 (designated F1 through F12), a PrintScreen key 20, a ScrollLock key 21, a Pause key 22 and a NumLock key 23. Moreover, the keyboard 1 further comprises: a NumLock indicator light 24, a CapsLock indicator light 25 and a ScrollLock indicator light 26, which are all constructed with light emission diodes (LED). The ON status and OFF status of the NumLock indicator light 24, a CapsLock indicator light 25 and a ScrollLock indicator light 26 indicates the ON status and OFF status of the NumLock key 23, the CapsLock key 18 and the ScrollLock key 21, respectively. The array of keys 10 further includes a Space bar 27 for inputting a blank space as a separator between characters; a typical keyboard layout as shown in FIG. 1 has a left-right symmetrical layout of two Alt keys 15, two Ctrl keys 16 and two Shift keys across the Space bar 27. Each of the above keys can be a membrane switch with a diode or a magnet sensor.

The microprocessor 11 detects which key on the array of keys 10 is pressed by a plurality of column scan lines 13 and a plurality of row scan lines 14. For example, each of the above keys can be individually connected in serial between one of the column scan lines 13 and one of the row scan lines 14; the microprocessor 11 can scan those column scan lines 13 repeatedly. When a key is pressed, the current conducts between the corresponding column scan line 13 and the row scan line 14, and the microprocessor 13 after detecting the conduction fetches the key code corresponding to the pressed key and outputs the key code to the main computer 2 according to a lookup table stored in the read only memory 12.

According to the present invention, it is defined that the key code represented by the Function keys 19, the PrintScreen key 20, the ScrollLock key 21 or the Pause key 22 will be changed from the original key code set stored in the read only memory 12 to another set only when one of the Alt key 15, the Ctrl key 16, or the Shift key 17 is pressed and immediately released without any insertion of the modifiable keys during the press-and-release operation. If there is no insertion, then the other key code set being switched to may represent multimedia hot keys. For example, CD, Video, Play, FF, FR, Volume+, Volume−, Mute, and Telephone, for accessing audio CD, accessing DVD, playing, fast forwarding, fast rewinding, turning up volume, turning down volume, muting and telephone dial up. Accordingly, the function keys 19, the PrintScreen key 20, the ScrollLock key 21 or the Pause key 22 can be converted into multimedia hot keys with a single modifier key. When the modifier key (one of the Alt key 15, the Ctrl key 16, or the Shift key 17 used for activating multimedia hot keys) is pressed and immediately released, the key code set represented by those multimedia hot keys, namely the Function keys 19, the PrintScreen key 20, the ScrollLock key 21 or the Pause key 22, will be switched back to the original key code set.

The present invention uses any of the NumLock indicator light 24, CapsLock indicator light 25 or the ScrollLock indicator light 26 on the keyboard 1 to indicate the status so the user may know the current status of the modifiable keys on the keyboard is either in the original key code set or the modified key code set representing the multimedia functions. If the Function keys 19, the PrintScreen key 20, the ScrollLock key 21 or the Pause key 22 are in the status of its original key code set, then the indicator lightremains displaying its ON or OFF light in a static manner; if the Function keys 19, the PrintScreen key 20, the ScrollLock key 21 or the Pause key 22 are in the status of multimedia function key code set, then the indicator light displays blinking light in a dynamic manner. When the indicator light displays blinking light in a dynamic manner, the blinking is closely related to the status of the indicator light before the Function keys 19, the PrintScreen key 20, the ScrollLock key 21 or the Pause key 22 are switched to the multimedia function key code set. If the indicator light is originally ON, then the indicator light displays a blinking light with longer ON than OFF after entering into the status of multimedia function key code set. For example, the ON time light lasts 1.5 seconds, and the OFF time darkness lasts 0.5 second. If the indicator light is originally OFF, then the indicator light displays a blinking light with shorter ON than OFF after entering into the status of multimedia function key code set. For example, the ON time light lasts 0.5 second, and the OFF time darkness lasts 1.5 seconds. Consequently, current status can be known to be either in the original key code set or the key code set representing multimedia functions by observing whether the indicator light is blinking or not. The original ON or OFF status can be known from the blinking manner of the indicator light; and it will be known whether the corresponding function of the indicator light has been activated. For example, if the NumLock indicator light 24 is originally ON, it indicates that those keys below it are number keys; if the NumLock indicator light 24 is originally OFF, it indicates that the keys below it are cursor direction keys.

When one of the switch keys such as the Alt key 15, the Ctrl key 16, or the Shift key 17 is first pressed and held in combination with a pressed modifiable key, which can be a Function key, a character key or a symbol key, the function or the character of the modifiable key being pressed will be changed. For example, the key combination of Shift+A generates a capital letter A and the Ctrl+C combination interrupts an action in a DOS mode. That is, the present invention still reserves the key combination functions commonly practiced.

Figure 2:
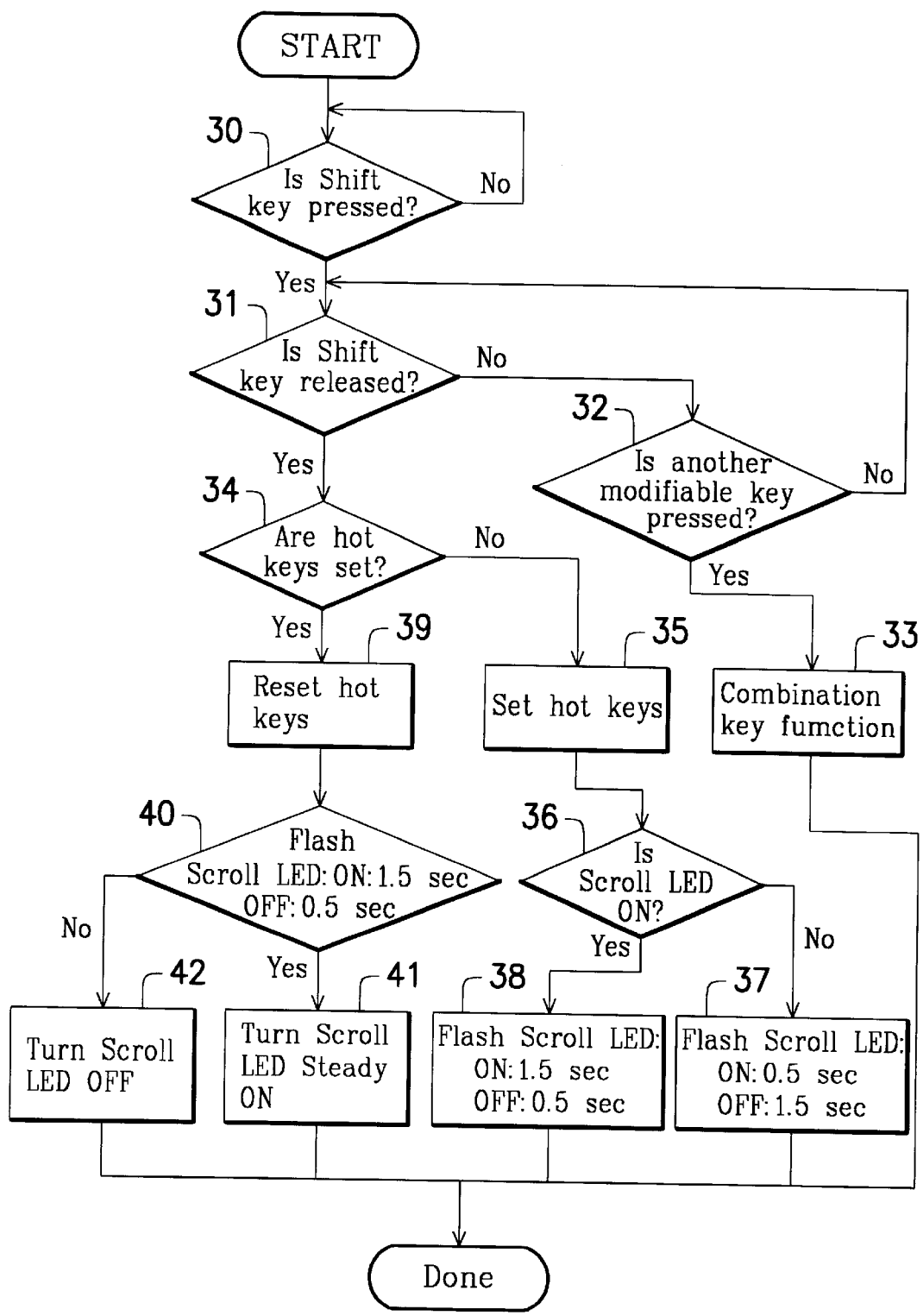
FIG. 2 is a flowchart illustrating one preferred embodiment of the present invention.

Refer to FIG. 2, a flowchart illustrating one preferred embodiment in accordance with the present invention. In the drawing, the Shift key 17 is exemplified for switching to or from multimedia hot keys; the switchable keys are Function keys 19 or less frequently used keys such as the PrintScreen key 20, the ScrollLock key 21 and the Pause key 22; and the ScrollLock indicator light 26 is exemplified for displaying the status of the current key code set.

First, in Step 30, it is detected whether the Shift key 17 is pressed; if not, the detecting of Step 30 proceeds, that is, the scanning of the array of keys 10 with the column scan line 13 and the row scan line 14 continues; if it is detected that the Shift key 17 is pressed, proceed to Step 31 to determine whether the Shift key 17 is released. If in Step 31 the Shift key 17 is determined to have been released, then proceed to Step 34; if not, proceed to Step 32 to determine whether a modifiable key is pressed; if not, return to Step 31, otherwise, perform the function of combination keys in Step 33.

In Step 34 it is determined whether the multimedia hot key setting has been activated; if not, the multimedia hot key function will be enabled; then proceed to Step 35 to switch the original key code set of the Function keys 19, the PrintScreen key 20, the ScrollLock key 21 or the Pause key 22 to the multimedia key code set. After setting the multimedia hot keys, proceed further to Step 36 to determine whether the ScrollLock indicator light 26 has been turned ON. If the ScrollLock indicator light 26 is originally turned ON, then the light will flash or blink in a manner with longer ON time than OFF time; for example, the ON time light lasts 1.5 seconds, and the OFF time darkness lasts 0.5 second in Step 38. If the ScrollLock indicator light 26 is originally turned OFF, then the light will flash or blink in a manner with shorter ON time than OFF time; for example, the ON time light lasts 0.5 second, and the OFF time darkness lasts 1.5 seconds in Step 37.

If in Step 34 it is determined that multimedia hot keys have been set, it means the multimedia hot key function of the Function keys 19, the PrintScreen key 20, the ScrollLock key 21 and the Pause key 22 is already enabled. In this case, the multimedia hot key function will be disabled and proceed to Step 39 to reset the Function keys 19, the PrintScreen key 20, the ScrollLock key 21 and the Pause key 22 and resume key codes to the original key code set. Then proceed further to Step 40 to determine the blinking manner of the ScrollLock indicator light 26. If the ON time light lasts 1.5 seconds, and the OFF time darkness lasts 0.5 second, the ScrollLock indicator light 26 was originally turned ON before entering into the multimedia hot key function; thus proceed to Step 41 to keep the light remaining ON. If not, proceed to Step 42 and turn the ScrollLock indicator light 26 OFF.

If the method of control of the present invention is presented as subroutines, then the above procedures 37, 38, 41, 42, when completed, will return to proceed the main program.

To summarize, the keyboard and method for switching key code according to the present invention ensure that various media function hot keys can be obtained by merely striking a single modifier key so as to switch the key code of the Function keys 19 and other less frequently used keys such as the PrintScreen key 20, the ScrollLock key 21 and the Pause key 22 on a standard keyboard to multimedia hot keys for accessing audio CD, accessing DVD, playing, fast forwarding, fast rewinding, turning up volume, turning down volume, muting and telephone dial up, without altering the mechanic structure of a standard keyboard and without using key combinations. In addition, the present invention uses any of the NumLock indicator light 24, CapsLock indicator light 25 or the ScrollLock indicator light 26 on the keyboard 1 to indicate the status by blinking light so the user may know whether the above keys currently represent the multimedia function key code set or the original key code set.

In the above embodiment, Function keys or less frequently used keys such as the PrintScreen key 20, the ScrollLock key 21 and the Pause key 22 are used as examples of the switched keys. All other existing keys, which provide the same effects, on the keyboard 1 also apply. The array of keys 10 is not limited to the standard 101-key IBM PC layout. The 88-key keyboard layout frequently found in notebook computers will also do the same.

It should be understood that the present invention is not limited to the preferred embodiment as disclosed above. Variations and modifications can be made by those who are skillful in the art without departing from the spirit and scope of the present invention as defined in the appended claims.

What is claimed is:

1. A method for switching the key code of a plurality of switchable keys between a first key code set and a second key code set; comprising:
   (a) providing a keyboard, including at least one modifier key and said switchable keys;
   (b) detecting whether said modifier key is pressed; if said modifier key is pressed proceeding to step (c);
   (c) determining whether a modifiable key is pressed before said pressed modifier key is released; if said modifier key is pressed and held while said modifiable key is struck performing a corresponding combination key function and completing said method; otherwise, proceeding to step (d); and
   (d) switching said switchable keys to said second key code set if before said modifier key has been struck said switchable keys correspond to said first key code set, and switching said switchable keys to said first key code set if before said modifier key has been struck said switchable keys correspond to said second key code set.

2. The method as claimed in claim 1, further comprising:
   (e) blinking an indicator light when said switchable keys are changed to said second key code set.

3. A keyboard, comprising:
   a key array comprising a modifier key and a plurality of dual purpose keys;
   a memory device for storing a first key code set and a second key code set for the dual purpose keys; and
   a detecting device for detecting the depression of keys;
   wherein the key code set employed for the dual purpose keys is alternated between the first key code set and the second key code set when the detecting device detects that the modifier key is pressed and released without the pressing of a modifiable key during the press-and-release operation.

4. The keyboard as claimed in claim 3, wherein said dual purpose keys are Function keys.

5. The keyboard as claimed in claim 3, wherein said dual purpose keys are the PrintScreen key, the ScrollLock key and the Pause key.

6. The keyboard as claimed in claim 3, wherein said memory device is a read only memory.

7. The keyboard as claimed in claim 3, further comprising an indicator light to indicate by a blinking light whether said dual purpose keys are being set into said second key code set.

8. The keyboard as claimed in claim 3, wherein said modifier key performs a combination key function when said modifier key is pressed and held while said modifiable key is struck.

9. The keyboard as claimed in claim 3, wherein said detecting device is a microprocessor.

10. The keyboard as claimed in claim 9, wherein said detecting device is provided with a row scan line and a column scan line to determine whether said modifier key is pressed.

* * * * *